US008689071B2

(12) United States Patent
Valakh et al.

(10) Patent No.: US 8,689,071 B2
(45) Date of Patent: Apr. 1, 2014

(54) MULTIMEDIA DEVICE TEST SYSTEM

(75) Inventors: Vladzimir Valakh, Troy, NY (US);
Vicente Miranda, Clifton Park, NY (US); Darby Racey, Voorheesville, NY (US)

(73) Assignee: Contec Holdings, Ltd., Schenectady, NY (US)

( * ) Notice: Subject to any disclaimer, the term of this patent is extended or adjusted under 35 U.S.C. 154(b) by 483 days.

(21) Appl. No.: 12/870,994

(22) Filed: Aug. 30, 2010

(65) Prior Publication Data

US 2012/0054567 A1 Mar. 1, 2012

(51) Int. Cl.
*G06F 11/00* (2006.01)
(52) U.S. Cl.
USPC .......................................... 714/742; 714/739
(58) Field of Classification Search
USPC ................................................. 714/742, 739
See application file for complete search history.

(56) References Cited

U.S. PATENT DOCUMENTS

| 6,735,341 | B1 | 5/2004 | Horie | |
|---|---|---|---|---|
| 7,003,167 | B2 | 2/2006 | Mukherjee | |
| 7,640,132 | B2 * | 12/2009 | Katagiri et al. | 702/123 |
| 7,751,633 | B1 | 7/2010 | Mukherjee | |
| 2004/0090616 | A1 * | 5/2004 | French et al. | 356/73.1 |
| 2005/0261855 | A1 * | 11/2005 | Adachi et al. | 702/108 |
| 2006/0182311 | A1 * | 8/2006 | Lev | 382/103 |
| 2008/0137968 | A1 | 6/2008 | Joung et al. | |
| 2009/0063431 | A1 | 3/2009 | Erol | |
| 2009/0067726 | A1 | 3/2009 | Erol | |
| 2009/0070110 | A1 | 3/2009 | Erol | |
| 2009/0070415 | A1 | 3/2009 | Kishi | |
| 2009/0074300 | A1 | 3/2009 | Hull | |
| 2009/0100050 | A1 * | 4/2009 | Erol et al. | 707/5 |
| 2009/0125510 | A1 | 5/2009 | Graham | |
| 2010/0102840 | A1 * | 4/2010 | Ueda et al. | 324/755 |

FOREIGN PATENT DOCUMENTS

| EP | 0789497 | A2 | 8/1997 |
|---|---|---|---|
| EP | 1624705 | A1 | 2/2006 |
| EP | 2164009 | A2 | 3/2010 |
| EP | 2202646 | A2 | 6/2010 |
| EP | 2207361 | | 7/2010 |
| WO | WO 2006/024698 | A1 | 3/2006 |
| WO | WO 2011/070320 | A2 | 6/2011 |
| WO | WO 2011/070320 | A3 | 6/2011 |

OTHER PUBLICATIONS

EPO Extended Search Report for EP application serial No. 11194503.6, mailed on May 23, 2012.

* cited by examiner

*Primary Examiner* — M. Mujtaba K Chaudry
(74) *Attorney, Agent, or Firm* — FSP LLC

(57) ABSTRACT

A test system includes a supervisor unit coupled to a control interface; the control interface coupled to first and second test modules, each test module comprising a first logic module to test macro blocking errors; a second logic module to perform optical character recognition; a third logic module to perform signal to noise ratio measurement; and a fourth logic module to perform random noise measurement; each test module coupled to a device under test, the four logic modules applied to test a menu-driven video decoding device.

7 Claims, 3 Drawing Sheets

MULTIMEDIA DEVICE TEST SYSTEM

TECHNICAL FIELD

The present disclosure relates to test systems.

BACKGROUND

Existing test systems for set tops and other devices suffer from lack of scalability. In existing systems a central processing unit employs a defined test sequence, receives and processes raw test data, and then analyzes and stores results. This is an inefficient and error prone approach.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

Figure 1:
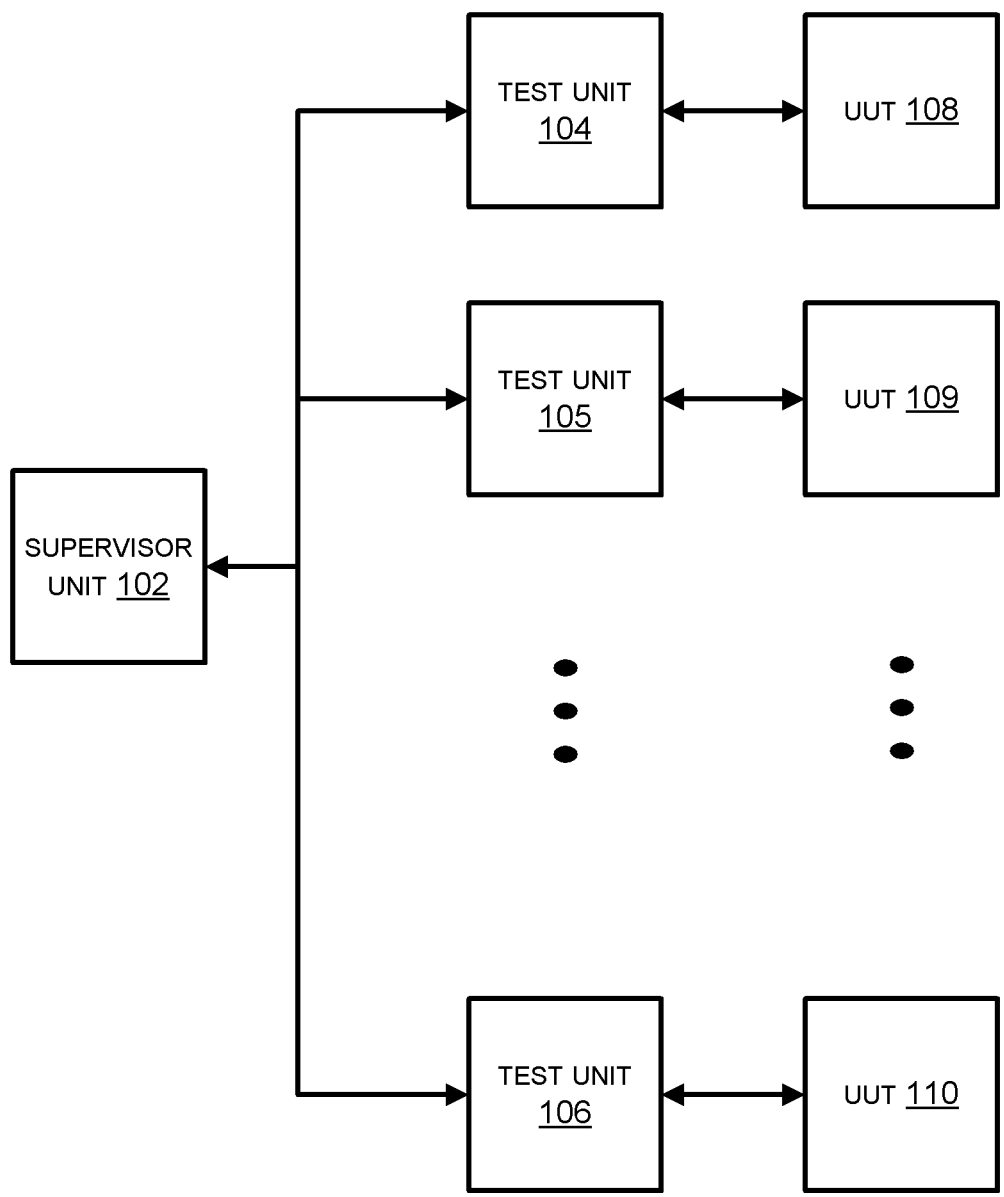
FIG. 1 is a block diagram illustration of an embodiment of a test system.

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to machine memory circuits, machine readable media, and/or circuitry which by way of its material and/or material-energy configuration comprises control and/or procedural signals, and/or settings and values, that may be applied to influence the operation of a device. Magnetic media, electronic circuits, electrical and optical memory (both volatile and nonvolatile), and firmware are examples of logic. Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein.

The techniques and procedures described herein may be implemented via logic distributed in one or more computing devices. The particular distribution and choice of logic is a design decision that will vary according to implementation.

A novel test system includes a supervisor unit coupled to a control interface. The control interface is coupled to multiple test modules. Each test module is coupled to a device under test with inputs and outputs that are decoded and sent to the test unit for further diagnostics. Each test module includes multiple logic modules. Among the logic modules are a first logic module to test macro blocking errors; a second logic module to perform optical character recognition; a third logic module to perform signal to noise ratio measurement; and a fourth logic module to perform random noise measurement. New or different logic modules may be included in the test module to configure the device under test under new specifications and/or requirements and process information to meet new test requirements.

The supervisor unit includes logic to start and control each module. Each test module includes server logic that is adapted to control each logic module of the test modules as a server service. Thus, the supervisor module may interact with each logic module of each test module using a client-server communication model.

Each test module may include additional logic modules, including one to communicate commands to setup the proper menus on the device under test, and one or more to perform tests with the multimedia device (e.g. Audio, DVR, Video).

The supervisor unit communicates control commands via the control interface to the multiple test modules. Each test module is associated with a device under test. Each (video related) logic module obtains a video frame from the device under test and operates on the video frame according to the control commands received from the supervisor unit. Each audio related logic module may configures the hardware on the test module to decode audio (e.g. PCM, Dolby) and processes information from the device under test (e.g. Frequency, THD). Each logic unit communicates to the supervisor unit, via the server interface of the associated test module, a result of operating on the video frame.

Commands from the supervisor unit to the test units (e.g. OCR, DVR, HSL, THD) may be implemented via a server-client messaging model. The test unit may include server logic which responds to commands from the server by initiating and/or controlling particular logic modules as server services on behalf of the supervisor unit.

The test modules may comprise logic to store in nonvolatile memory one or more reference patterns for use by the logic modules. Commands from the supervisor unit to the test units to control certain logic modules (e.g. for macroblocking, for SNR) may solely use the reference pattern (e.g. HSL reading), or the test unit may use a combination of the test patterns stored in nonvolatile memory and the reference pattern(s) being used as the source signal to verify the multimedia device presents no video related issues (e.g macroblocking, SNR).

FIG. 1 is a block diagram illustration of an embodiment of a test system. A supervisor unit 102 comprises logic to communicate commands to a plurality of test units 104-106. Each test unit 104-106 responds to the commands by performing certain tests on a unit under test (UUT) 108-110.

Each test unit 104-106 operates under remote control of the supervisor unit 102, and also operates somewhat autonomously. Described herein is a unique combination of remote control and autonomous operation for particular test procedures, including optical character recognition (OCR), signal to noise ratio (SNR), random noise measurement, audio quality, and video quality (e.g. macroblocking).

Figure 2:
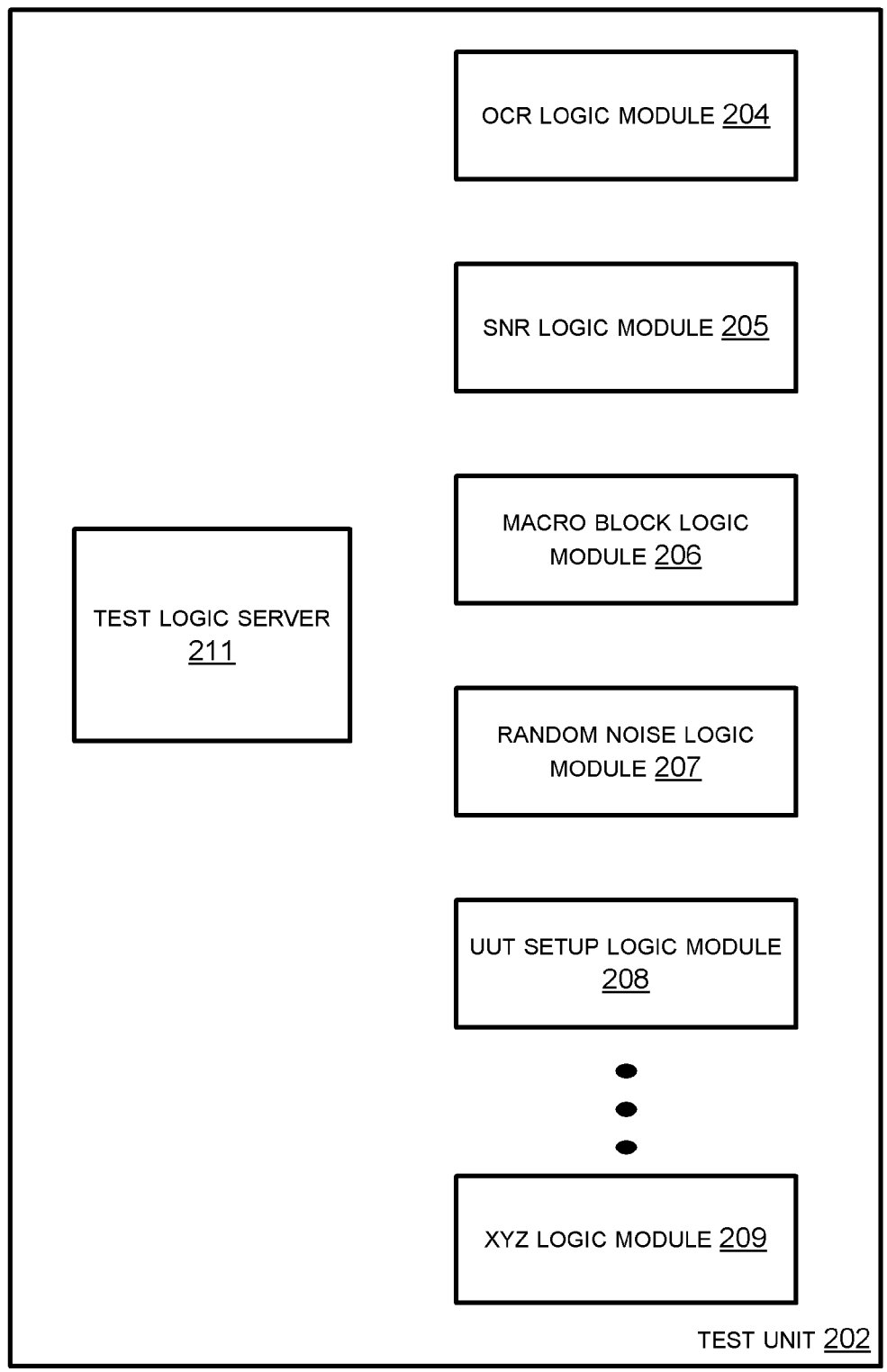
FIG. 2 is a block diagram illustration of an embodiment of logic modules in a test unit.

FIG. 2 is a block diagram illustration of an embodiment of a test unit. The test unit 202 comprises a plurality of logic modules 204-209, including logic modules to perform an OCR test 204, SNR test 205, macro blocking test 206, random noise test 207, unit under test setup 208, and also potentially other tests and procedures 209.

The test unit 202 further comprises server logic 211 which enables the logic modules 204-209 to be controlled as server processes via a client-server communication mechanism.

One embodiment of commands to control the various logic modules is provided in Table 1. The following parameters are common to several of the commands:

handler—a reference to the logic module to which the command is directed.

SKT—Socket number, indicates which of a plurality of logic boards to direct the OCR command to (SKT=1, 2, 3 etc.).

STBType—an identifier of the type of the unit under test (e.g. make/model, series number, firmware/software revision number, etc.).

IRCmds—infra red commands (OEM dependant) directed to the unit under test to set its state and/or control its behavior for testing purposes.

| Command | Description | Parameters |
|---|---|---|
| oemOCR (handler, SKT, STBType, PageNo, IRCmds, res) | Commands the OCR logic that converts a video frame or image into an ASCII text file. This function call instructs the OCR logic to get an area of a frame, or a ROI (Region of Interest) on a video output of the set-top box, and converts it to text. Once the text is obtained, the OCR logic may determine whether an identified set of characters is present in the text. | pageNo—A self-diagnostic menu the device under test provides with information in regards to its statuses, provisioning and code download object that can be analyzed through OCR via logic modules.<br>res—res is a memory location where results of conversion are stored. The contents of res are formatted as ASCII text. |
| DVRFct (handler, SKT, STBType, ch1, outSNR1, outHSL1, ch2, outSNR2, outHSL2) | Commands the signal-to-noise ratio test logic based on monitoring the maximum and minimum values of a video signal during a time window. The parameters of different test patterns are stored into logic (e.g. an FPGA) of the test unit. | ch1—identifies the channel that is played on the primary tuner of the unit under test. The content on ch1 may be recorded and analyzed.<br>outSNR1—the value obtained by calculation of the Signal to Noise Ratio on the content on channel ch1. This value is passed back to the caller.<br>outHSL1—Hue, Saturation and Luma values obtained from the content on ch1.<br>ch2—identifies the channel that is played on the secondary tuner of the unit under test. The secondary channel ch2 is exercised to stress the unit under test during the recording of the content on ch1 (the primary channel).<br>outSNR2—the calculation of the Signal to Noise Ratio for the secondary channel.<br>outHSL2—Hue, Saturation and Luma obtained from the content from the secondary channel. |
| AudTest (handler, SKT, STBType, anCh, digCh, audType, IRcmds, res) | Commands the audio test logic to verify the quality of the unit under test analog and digital audio outputs. The unit under test is to be set on a defined test pattern, comprising an audio tone with a known frequency and amplitude. The audio from the unit under test is demodulated and output to the test unit. | anCh—the channel used for analog audio verification. The channel has a defined (expected) amplitude and frequency.<br>digCh—the channel to use for digital audio verification. This channel has a defined (expected) amplitude and frequency.<br>audType—indicates the type of the output being evaluated. The test module configures its hardware to decode an analog signal as well as digital audio such as PCM and Dolby 5.1 format. |

-continued

| Command | Description | Parameters |
|---|---|---|
| | | res—return value, equal to zero when no errors were found in the audio signal tested. |
| MacroTest (handler, SKT, STBType, pattern, ch, res) | Commands the macro block test logic. A stream of video frames are compared against a reference frame in real time. Excessive macro blocking in the stream indicates faulty video codec logic in the unit under test. | pattern—the pattern to use as a reference. Each test pattern has unique number - 1, 2, 3 . . . etc. Different types of unit under test require specific reference test patterns. The pattern itself may be stored by the test unit.<br>ch—channel to tune for the video stream to test. The channel may vary depending on the type of unit under test.<br>res—a memory location where results of testing are stored. A value of zero indicates no errors where found. If there were frames with excessive macroblocks this value indicates the number of defective frames detected during the test time. |
| Pretest (handler, SKT, STBType, defCh) | Commands logic to set up menus of the unit under test and perform other pretesting. | defCh—used as a reference for some types of unit under test. Depending on the configuration of the unit under test, after initialization the unit displays the default configuration (e.g. specific channel) and statuses that indicates the unit is ready for testing. |
| VideoTest (handler, SKT, STBType, remCh, pattern, videoType, ch, res) | 1. Configure the input to be analyzed by the test module.<br>2. Grab the frame or sets of frames for evaluation<br>3. Video analysis with the test module to determine quality of the frame(s)<br>4. For testing colors space accuracy the color bars pattern applied to UUT and then firmware related algorithm samples video signals from different lines (up to 8) and for each color bar. Then the algorithm calculates average values of video samples for each color bar, reconstructs RGB values and then calculates HSL values.<br>5. PSNR. The ratio between the maximum power of the signal and the power of the noise can be obtained by the test module calculation representing the degree of quality of the video frame obtained | remCh—the channel to tune for the video test. For many types of devices under test, this will be channel 3 or 4.<br>pattern—this parameter is passed when a golden pattern is needed in order to define which values and lines to extract from the video frame. It might not be required when the feed is a live video sample.<br>videoType—indicates the type of video output from which to sample the video frames. Some values are baseband, rf output, high definition component, or HDMI signal.<br>ch—Specific channel the device under test is locked to before performing audio and video analysis. Test patterns or a specific live video is being displayed on the various outputs of the device under test and then the signal is decoded by the test module.<br>res—when res is equal to zero it indicates no errors where found during the call. If there was a system error or a failure on the unit, an error code may be used to troubleshoot or fail a bad unit. |

Figure 3:
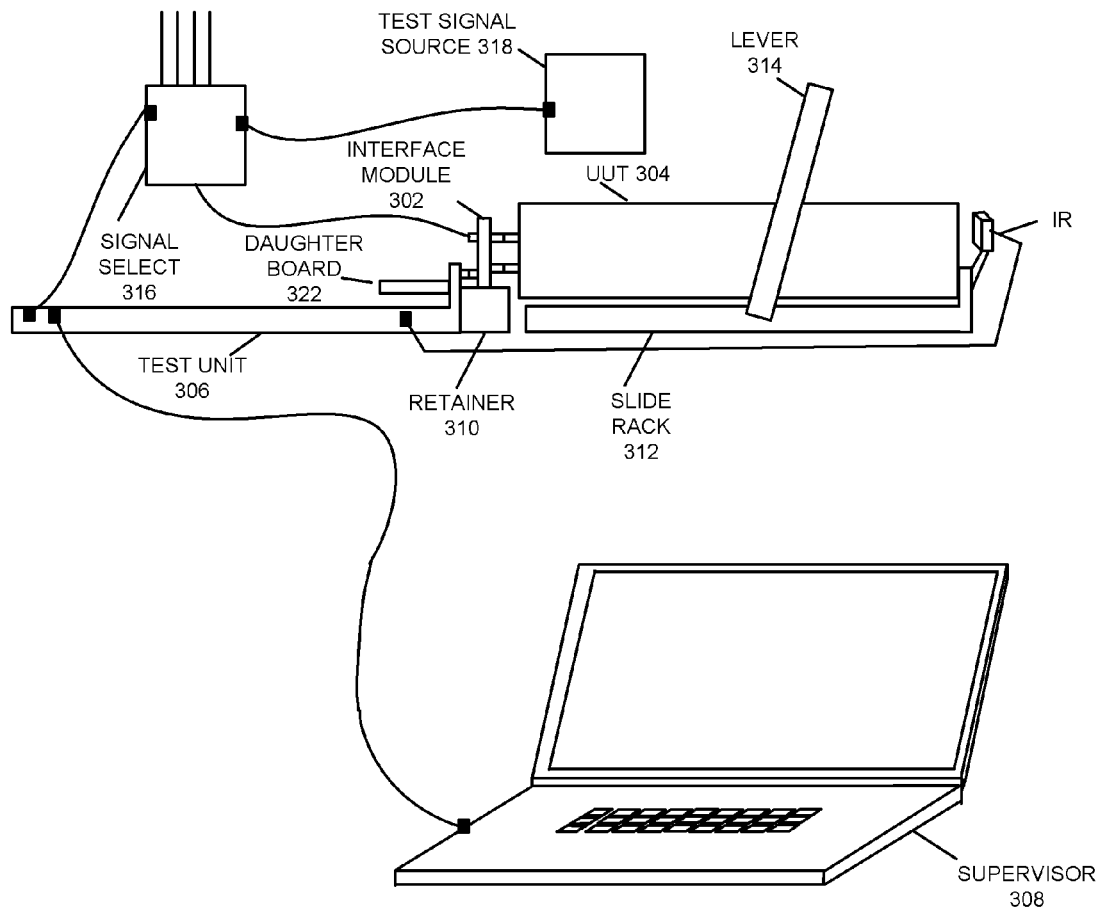
FIG. 3 is a block diagram illustration of an embodiment of a test system including a pluggable, type-specific modular interface between a test unit and a unit under test.

FIG. 3 illustrates an embodiment of a novel automated test system for end-user devices. Inputs to a unit under test (UUT) are received at a pluggable interface module 302, which adapts and positions the signals to be received by the UUT 304. The interface module 302 comprises inputs to and outputs from the UUT 304.

A multi-media format board 306 (MFB) may be configured with logic that is downloaded and installed on the board 306, making it a programmable multi-media format board (PMFB). This may enable use of a single PMFB with multiple makes and models of UUT. The PMFB 306 may be configured to provide all of the inputs that the UUT 304 receives, and to receive all outputs of interest for testing from the UUT 304. In this manner, it may be possible to simply disengage a particular UUT from the interface module 302, and plug in a new UUT, without manually removing or installing any cabling or connections to the UUT 304 or PMFB 306. A daughter board 322 may be employed to couple the PMFB 306 the interface module 302.

The daughter board 322 may comprise an identification (e.g. an assembly part number) that corresponds to the supported model. This identification may be coded into a non-volatile memory of the daughter board 322. The PMFB 306 may be adapted to automatically detect the make and model of a UUT 304 coupled thereto by interacting with the UUT 304 and/or with the daughter board 322, and may download and/or activate appropriate logic (e.g. from the test/analysis logic 308) to interact with and facilitate the testing of the UUT 304. Upon detecting the make and model of a UUT 304, the PMFB 306 may inform the supervisor logic 308 of this information, so that the supervisor logic 308 may select appropriate test and analysis logic for the UUT 304. Logic of the test system may provide for parallel processing, such that each UUT 304 may be tested independently and concurrently. Multi-threading may be employed to accomplish this.

The PMFB 306 may convert outputs of the UUT 304 to a binary format suitable for processing and analysis. Each PMFB 306 may have associated test logic modules and may output results in parallel to shared supervisor logic 308. Outputs of the PMFB 306 to supervisor logic 308 may be provided in some embodiments via universal serial bus (USB), Ethernet, wireless, or other transport method. The pluggable interface module 302 may be adapted to fit, e.g. slot into, a retainer 310. The interface module 302 is interchangeable and may be specific to a make and model of UUT 304, whereas the retainer 310 may comprise a universal configuration (inputs and outputs) common among all makes and models of UUT 304. A slide rack 312 driven by a lever 314, crank, or other mechanism may be provided for loading the UUT 304 and for mechanically engaging it with the interface module 302 via operation of the lever 314 or other control The lever 314 or other control may likewise be employed to disengage the UUT 304 from the interface module 302, at which point the UUT 304 and/or the modular interface 302 may be removed and replaced with another UUT 304 and/or interface module 302. The pluggable interface may include an identification in non-volatile memory of a number of times it has been interfaced (e.g. plugged into) units under test.

The PMFB 306 may comprise logic for the decoding and reformatting of various media formats. The format logic may also support S/PDIF and/or coaxial/optical audio formats, to name just some examples. Logic to decode different media formats may be downloaded by the PMFB 306 in some embodiments. Thus, a single PMFB 306 may be employed with various UUTs that operate upon or output various media formats.

Polling, control, initialization, and configuration signals provided by the service provider (e.g., a cable television network operator, an Internet Service Provider, etc.) to the UUT are provided via a source signal selector 316. The source signal selector 316 may choose from among multiple available service provider sources and direct signals from the chosen source to the interface module 302 (note that the signals from the chosen source may in some implementations be directed to the retainer 310, which may comprise inputs and outputs common to all makes and models of UUT 304. For example, the source signal selector 316 may choose signals from a particular headend of a cable television provider, depending upon the make/model of the UUT 304. The source signal selector 316 may choose signals from different service providers depending on the type of UUT (e.g. set top box, game console, etc.). The source signal selector 316 may comprise a configurable RF attenuation control to stress the RF input of the unit under test. This may be employed to detect anomalies on units failing when the RF level is below certain threshold levels.

A carousel server (OLL, e.g. a Motorola Offline Loader, not shown in drawings) may be employed to load code objects on various set-top boxes. Deploying an OLL may increase the throughput of loading desired code objects independent from a service provider source. The signal selector 316 may be used in conjunction with the OLL to help prepare the set-top boxes with specific code objects.

The supervisor 308 may determine the make and/or model of the UUT 304. If the supervisor 308 makes this determination, it may in some embodiments communicate the make/model information to the PMFB 306 to direct the source signal selector 316 to select a particular source. Media signals may be provided via a tunable RF channel from a local source 318, instead of from the provider network. The local source need not be "local" to the test system, but may be any source other than the service provider network. The local media test signals may be substituted for signals from the provider network (e.g. the provider signals may be filtered out and replaced), or the local signals may supplement the polling, control, initialization, and configuration signals normally provided by the service provider.

The source 318 of the local media test signals may be a separate server for this purpose. In some embodiments, the media test signals may be selected according to the make and/or model of the UUT 304. The system may include logic to apply the media test signals to the UUT via a same physical medium as service provider configuration signals are applied to the UUT. This logic may be comprised by the source signal selector 316, the pluggable interface module 302, the media format board 306, or some other device (e.g. an RF coupler in the signal path).

Control signals that drive features of the UUT 304 may be provided, for example by an IR port and/or USB from the PMFB 306. PCI or SPI control and data exchange may also be employed to interact with the UUT 304. The PMFB 306 may operate as a frame grabber which captures one or more frames output by the UUT 304, buffers the captured frame(s), tests the frames, and transfers results to the supervisor logic 308, for example via a USB interface.

Logic to capture and process new/updated or different media formats, or to interact with new/different makes and models of UUT 304, may be dynamically loaded to the PMFB 306 by the supervisor logic 308 or another device. Dynamic loading of logic to the PMFB 306 may be based upon a determination of the make and/or model number of the UUT 304.

A test platform employing features of the described test system embodiment(s) may be arranged in horizontal, vertical, and/or grid configurations, to name some of the possibilities.

IMPLEMENTATIONS AND ALTERNATIVES

Those having skill in the art will appreciate that there are various logic implementations by which processes and/or systems described herein can be effected (e.g., hardware, software, and/or firmware), and that the preferred vehicle will vary with the context in which the processes are deployed. "Software" refers to logic that may be readily readapted to different purposes (e.g. read/write volatile or nonvolatile memory or media). "Firmware" refers to logic embodied in read-only memories and/or media. Hardware refers to logic embodied in analog and/or digital circuits. If an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A test system comprising:
    a supervisor unit coupled to a control interface;
    the control interface coupled to first and second test modules, each test module comprising
    a first logic module to test macro blocking errors;
    a second logic module to perform optical character recognition;
    a third logic module to perform signal to noise ratio measurement;
    and a fourth logic module to perform random noise measurement;
    each test module coupled to a device under test, the four logic modules applied to test a menu-driven video decoding device.

2. The test system of claim 1, further comprising:
    each test module comprising a fifth logic module to communicate commands to setup the proper menus on the device under test.

3. The test system of claim 1, further comprising:
the supervisor unit comprising logic to configure a behavior of each logic module.

4. The test system of claim 1, each test module comprising server logic, the server logic adapted to control each logic module as a server service.

5. The test system of claim 1, further comprising:
the test modules comprising logic to store in nonvolatile memory one or more reference patterns for use by the logic modules.

6. A process comprising:
a supervisor unit communicating control commands via a control interface to multiple test modules, the commands communicated to each of a first logic module to test macro blocking errors; a second logic module to perform optical character recognition; a third logic module to perform signal to noise ratio measurement; and a fourth logic module to perform random noise measurement;

each logic module obtaining a video frame from a menu driven video decoding device under test and operating on the video frame according to the control commands received from the supervisor unit;

each logic unit communicating a result of operating on the video frame to the supervisor unit.

7. The process of claim 6, each test module comprising server logic and communicating with the supervisor unit via a client-server communication model.

* * * * *